(12) United States Patent
Taira

(10) Patent No.: US 6,461,540 B2
(45) Date of Patent: Oct. 8, 2002

(54) CONDUCTIVE PASTE AND MULTI-LAYER CERAMIC ELECTRONIC COMPONENT USING THE SAME

(75) Inventor: Shinichi Taira, Shiga-ken (JP)

(73) Assignee: Murata Manufacturing Co., Ltd. (JP)

( * ) Notice: Subject to any disclaimer, the term of this patent is extended or adjusted under 35 U.S.C. 154(b) by 14 days.

(21) Appl. No.: 09/812,453

(22) Filed: Mar. 20, 2001

(65) Prior Publication Data

US 2001/0032737 A1 Oct. 25, 2001

(30) Foreign Application Priority Data

Mar. 30, 2000 (JP) ......................................... 2000-093373

(51) Int. Cl.[7] ............................. H01B 1/16; H01H 1/02; H01R 12/00
(52) U.S. Cl. ........................ 252/514; 428/901; 428/929; 174/120 R; 174/256
(58) Field of Search ............................. 252/514, 520.3; 427/96; 428/901, 929; 174/256, 120 R

(56) References Cited

U.S. PATENT DOCUMENTS 5,250,229 A * 10/1993 Hara et al. ................... 252/518
5,561,587 A    10/1996 Sanada
5,665,459 A *  9/1997 Fukuta et al. ................ 428/209

FOREIGN PATENT DOCUMENTS

JP            7-161223        6/1995

* cited by examiner

Primary Examiner—Mark Kopec
(74) Attorney, Agent, or Firm—Ostrolenk, Faber, Gerb & Soffen, LLP

(57) ABSTRACT

A conductive paste for forming external electrodes of a multi-layer ceramic electronic component contains an Ag-based conductive component, an organic vehicle and a glass frit. The glass frit in the conductive paste contains $B_2O_3$, $SiO_2$, PbO, and $Al_2O_3$. The total content of $SiO_2$ and $Al_2O_3$ in the glass frit is in the range of about 40 to 56 molar percent, the $SiO_2$ content being in the range of about 20 to 40 molar percent and the $Al_2O_3$ content being in the range of about 12 to 24 molar percent.

20 Claims, 1 Drawing Sheet

CONDUCTIVE PASTE AND MULTI-LAYER CERAMIC ELECTRONIC COMPONENT USING THE SAME

BACKGROUND OF THE INVENTION

1. Field of the Invention

The present invention generally relates to conductive pastes and multi-layer ceramic electronic components using the same. Specifically, the present invention relates to a conductive paste suitable for forming external electrodes of a multi-layered ceramic capacitor mainly composed of a Pb-perovskite-type ceramic component, and to a multi-layer ceramic capacitor using the conductive paste.

2. Description of the Related Art

A conventional multi-layer ceramic electronic component includes, for example, a ceramic composite, internal electrodes and external electrodes. A typical ceramic composite is made by baking a green composite comprising plural green ceramic layers composed of dielectric material. The internal electrodes disposed between the ceramic layers of the ceramic composite are formed by applying a conductive paste on each of the green ceramic layers by means of printing and then simultaneously baking the green ceramic layers and the applied paste. Each of the internal electrodes has one end exposed on a predetermined end face of the ceramic composite. The external electrodes are formed by baking a conductive paste applied on outer surfaces of the ceramic composite so as to provide the connection between the external electrodes and the exposed ends of the internal electrodes on the end face of the ceramic composite. The external electrodes are plated to improve the solder wettability required when the multi-layer ceramic electronic component is mounted on a circuit board or the like.

When silver (Ag) is employed as the conductive component of the conductive paste for forming the external electrodes, the Ag contained in the external electrodes diffuses into the electrically and mechanically connected internal electrodes during baking, thereby increasing the volume of the internal electrodes. Consequently, stress is generated in the vicinity of the end faces of the ceramic composite and is increased as the dispersion of silver progresses. As a result, the ceramic composite may suffer from cracks at an elevated baking temperature. Moreover, when a low-melting-point glass having a low flow temperature, i.e., a softening point of approximately 400° C., is used as a glass frit in the conductive paste, the dispersion of Ag is accelerated by the glass, causing the ceramic composite to crack at a temperature lower than the marginal temperature at which the ceramic composite otherwise cracks as stated above. In this respect, when, for example, the ceramic composite is composed of a Pb-perovskite-type ceramic component such as $PbTiO_3$ and the conductive component in the conductive paste for forming the external electrodes is Ag, the external electrodes are baked at a relatively low temperature ranging from 550° C. to 650° C. As the low-melting-point glass, Known is a glass mainly composed of B, Si and Pb, and containing Zn, Al and Ti in addition, as disclosed in Japanese Unexamined Patent Application Publication No. 7-161223.

However, the external electrodes baked at such a low temperature may not always be satisfactorily sintered. As a result, when the external electrodes are plated, the plating solution infiltrating into the external electrodes reaches the interface between the external electrodes and the ceramic composite, and, eventually, the interface between the internal electrodes and the ceramic composite, causing the internal electrodes to separate due to electrochemical reactions and the ceramic composite to crack. Such defects inside the composite often result in insufficient insulation and undesirable short circuits, thereby degrading the reliability of the multi-layer ceramic electronic component.

Moreover, insufficient sintering also results in the defective connections between the external electrodes and the internal electrodes, thus failing to achieve desired electrical characteristics as a multi-layer ceramic electronic component.

SUMMARY OF THE INVENTION

Accordingly, it is an object of the present invention to provide a conductive paste capable of inhibiting the generation of defects inside the ceramic composite and forming external electrodes having superior reliability as the electronic component while securing the connections between the internal and external electrodes, even when plating is performed on the external electrodes. Another object of the present invention is to provide a multi-layer ceramic electronic component having external electrodes formed by the conductive paste.

To these ends, a conductive paste according to one aspect of the present invention includes an Ag-based conductive component, an organic vehicle and a glass frit. The glass frit includes B in the form of $B_2O_3$, and Si in the form of $SiO_2$, Pb in the form of PbO and Al in the form of $Al_2O_3$. The total content of $SiO_2$ and $Al_2O_3$ in the glass frit is in the range of about 40 molar percent to about 56 molar percent.

A multi-layer ceramic electronic component according to another aspect of the present invention includes a ceramic composite having a plurality of stacked ceramic layers and external electrodes formed on outer surfaces of the ceramic composite. The external electrodes are formed by baking the conductive paste of the present invention described above.

DETAILED DESCRIPTION OF EMBODIMENTS OF THE INVENTION

Figure 1:
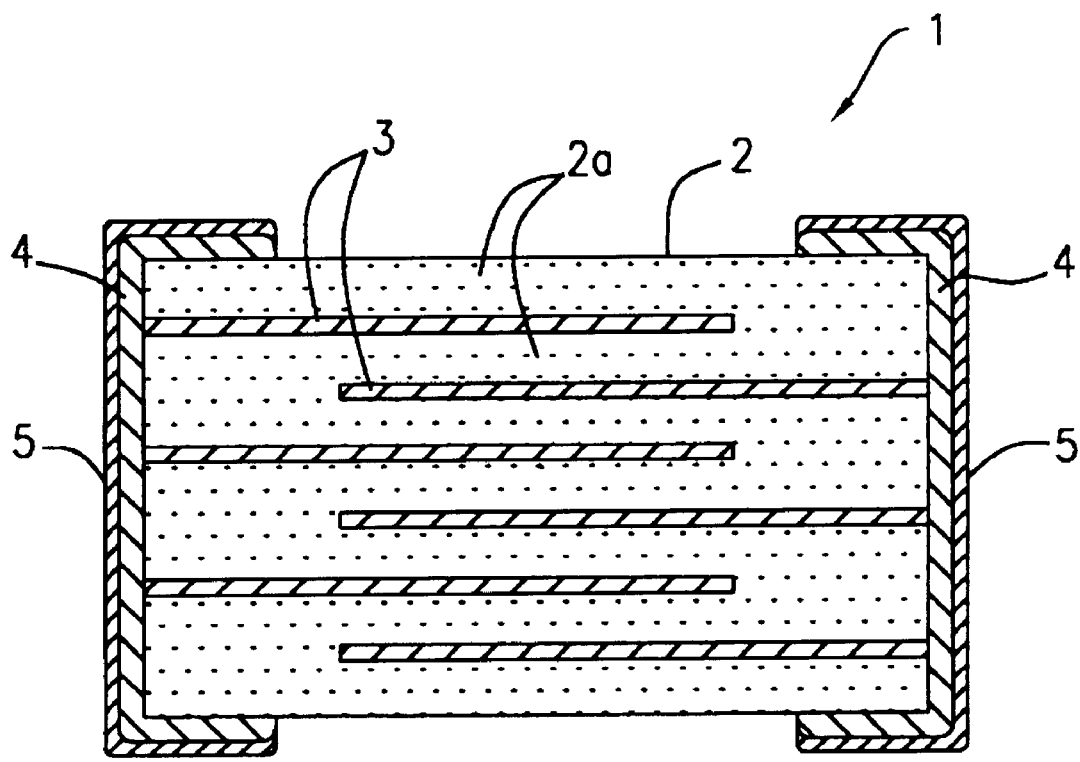
FIG. 1 is a cross-sectional view of a multi-layer ceramic electronic component according to an embodiment of the present invention.

A glass frit contained in a conductive paste of the present invention should contain B, Si, Pb and Al in the forms of $B_2O_3$, $SiO_2$, PbO and $Al_2O_3$, respectively. The total content of $SiO_2$ and $Al_2O_3$ should be in the range of about 40 molar percent to about 56 molar percent.

The Inventor has conducted research and experiments regarding the solubility of the glass by using a commercially available Sn plating solution, and have found that the conductive paste containing the glass frit having the following composition is suitable for forming external electrodes.

In a B—Si—Pb—Al—O type glass frit containing $B_2O_3$, $SiO_2$, PbO and $Al_2O_3$, when the $Al_2O_3$ content in the glass frit is less than about 12 molar percent, the solubility of the glass becomes relatively high and it is difficult to inhibit defects inside the ceramic composite developed by plating. When the $Al_2O_3$ content in the glass frit exceeds about 24 molar percent, vitrification becomes difficult and bubbles are generated during baking, resulting in defects of the external electrodes, such as development of open pores. In view of the above, the $Al_2O_3$ content in the glass frit is preferably in the range of about 12 to 24 molar percent.

The Inventor has also conducted research regarding the content of $SiO_2$ in the glass frit and have found the following. When the $Al_2O_3$ content in the glass frit is in the range of about 12 to 24 molar percent and the $SiO_2$ content in the glass frit is about 20 molar percent or more, solubility of the glass in the plating solution can be significantly decreased. The Inventor has also found that when the $SiO_2$ content in the glass frit is increased, glass transition point or glass softening point drastically increases. When the $SiO_2$ content in the glass frit exceeds about 40 molar percent, there is a danger that the conductive paste may be insufficiently sintered when baked at a low temperature in a range of approximately 550° C. to 650° C. Accordingly, the content of $SiO_2$ in the glass frit is preferably in the range of about 20 to 40 molar percent.

As for the total content of $Al_2O_3$ and $SiO_2$, it is preferable that the total content in the glass frit be about 40 molar percent or more so as to reduce the solubility in the plating solution. On the other hand, in order to satisfactorily sinter the external electrodes and secure the connections between the internal electrodes, the total content of the $SiO_2$ and $Al_2O_3$ in the glass frit should be about 56 molar percent or less.

More preferably, the total content of $SiO_2$ and $Al_2O_3$ in the glass frit is in the range of about 46 molar percent to about 52 molar percent. The $SiO_2$ content in the glass frit is more preferably about 26 molar percent to about 36 molar percent. The $Al_2O_3$ content in the glass frit is more preferably in the range of about 14 molar percent to about 20 molar percent.

Furthermore, when the content of $B_2O_3$ in the glass frit is decreased, solubility in the plating solution is reduced on one hand, but on the other hand, the glass frit becomes difficult to vitrify and difficult to sinter at a low temperature due to the increased viscosity. The content of $B_2O_3$ in the glass frit is preferably within the range of about 10 molar percent to about 30 molar percent. More preferably, the balance of the glass frit is PbO.

When the content of the glass frit in the conductive paste is reduced, such a conductive paste tends to allow the plating solution to infiltrate into the external electrodes. Conversely, when the content of the glass frit is excessively increased, the glass frit bleeds out onto the surface of the electrodes during baking, thereby degrading the platability. In this respect, the volume ratio of the conductive component to the glass frit is preferably in the range of about 92:8 to 80:20.

Next, a multi-layer ceramic electronic component according to an embodiment of the present invention is described with reference to FIG. 1.

An electronic component 1 shown in FIG. 1 comprises a ceramic composite 2, internal electrodes 3, external electrodes 4 and plating layers 5.

The ceramic composite 2 is formed by sintering a green ceramic composite comprising a plurality of ceramic layers 2a composed of a dielectric material of, for example, Pb-perovskite-type ceramic containing $PbTiO_3$ as the main component.

Each of the internal electrodes 3 is disposed between the ceramic layers 2a inside the ceramic composite 2. Each of the internal electrodes 3 is formed by applying, by means of printing, a conductive paste on one of the green ceramic layers 2a and by simultaneously baking the applied conductive paste and the green ceramic composite comprising the green ceramic layers. One end of each internal electrode 3 is exposed on a predetermined end face of the ceramic composite 2.

The external electrodes 4 are formed by applying the conductive paste of the present invention on the end face of the ceramic composite 2 and sintering at a temperature in the range of about 550° C. to 650° C., so as to electrically and mechanically connect the external electrodes 4 and the ends of the internal electrodes 3 exposed on the end face of the ceramic composite 2.

Each of the plating layers 5 is made by Sn—Ni electroless plating, Sn—Ni electroplating, Sn—Pd electroless plating or Sn—Pd electroplating. Each of the external electrodes 4 may be provided with one or more layer of the plating layers 5.

It should be noted that although the conductive paste of the present invention is particularly useful for the ceramic composite 2 of the multi-layer ceramic electronic component comprising a Pb-perovskite-type ceramic, the scope of the invention is not limited to the above-described embodiment and can be applied to the ceramic composite 2 composed of other dielectric material such as $BaTiO_3$, $PbZrO_3$, or the like, an insulator, a magnetic material, or a semiconductor material.

Moreover, the number of the internal electrodes provided inside the multi-layer ceramic electronic component is not limited to the above-described embodiment.

Furthermore, as the Ag-based conductive powder, a powder of elemental Ag, Ag/Pt alloy, Ag/Pd alloy or a powder containing Ag as the main component mixed with other metallic component(s) may be employed.

EXAMPLES

First, starting materials were blended at the proportions shown in Table 1. The blended materials were then melted, were quenched, and were crushed so as to obtain eight types of glass frit having different compositions.

The conductive paste Samples 1 to 8, each containing one of the eight types of glass frit, were then prepared by dispersing 70 percent by weight of non-spherical powdered silver or silver flakes, both having a grain size of 0.1 to 20 $\mu m$, and 5 percent by weight of the glass frit into 25 percent by weight of an organic vehicle.

Next, a number of ceramic composites made of a dielectric material mainly composed of $PbTiO_3$ were prepared by applying another conductive paste (a conductive paste for forming internal electrodes) on each of the plural green ceramic layers 2a of the green ceramic composite 2 and baking the conductive paste and the green ceramic composite simultaneously so as to obtain the internal electrodes each of which is disposed between the ceramic layers 2a and has one end being exposed on a predetermined end face of the ceramic composite 2.

Next, on the two end faces of each above-described ceramic composite, one of each conductive paste Samples 1 to 8 was applied by dipping, was dried, and was baked at a temperature of 600° C. so as to form a pair of external electrodes on the ceramic composite. 1,000 capacitance test pieces were fabricated for each of the Samples 1 to 8.

The fabricated capacitance test pieces employing the conductive paste Samples 1 to 8 underwent 200 charge-discharge cycles to check changes in capacitance before and after charge/discharge. The number of test pieces of which the capacitance was decreased by 10 percent or more was counted, and the proportion of such test pieces among 1,000 test pieces was calculated as the rate of capacitance decrease after charge-discharge, as shown in Table 1.

Next, an Sn plating layer was formed on each of the capacity test pieces employing the conductive paste Samples 1 to 8 by using a commercially available neutral Sn plating solution, was rinsed thoroughly by deionized water and was dried to obtain 1,000 test pieces for internal defect testing for each of the Samples 1 to 8. It should be noted here that although it is preferable to first form an Ni plating layer on the external electrode of each of the above-described capacitance test pieces and then form an Sn plating layer thereon, the Sn plating layer was directly formed on the external electrode without first forming the Ni plating layer in this Example. This was done with intent to clearly show the effect of reducing the rate of internal defect generation achieved by the present invention, as is described below.

The thus obtained internal defect test pieces employing the Samples 1 to 8 then underwent ultrasonic flaw detection and the number of the test pieces suffered from internal defects was counted. The proportion of such test pieces among 1,000 test pieces was calculated as the rate of internal defect generation, as shown in Table 1.

Particularly when the $SiO_2$ content in the glass frit is set in the range of about 20 to 40 molar percent and the $Al_2O_3$ content in the glass frit is set in the range of about 12 to 24 molar percent, it becomes possible to form highly reliable external electrodes capable of inhibiting the generation of defects inside the ceramic composite while securing the connections between the internal and external electrodes even when plating is performed on the external electrodes.

Furthermore, the multi-layer ceramic electronic component of the present invention is highly reliable as an electronic component since the external electrodes thereof are formed by baking the conductive paste of the present invention, thereby securing connections between the internal and external electrodes of the component and inhibiting the generation of defects inside the ceramic composite caused by infiltration of the plating component contained in the plating layer on the external electrode.

TABLE 1

| | Component of glass frit (mol. %) | | | | | Glass frit | | Capacitance | Rate of internal |
|---|---|---|---|---|---|---|---|---|---|
| Sample | $B_2O_3$ | PbO | $SiO_2$ | $Al_2O_3$ | $SiO_2 + Al_2O_3$ | Transition point °C. | Softening point °C. | decrease rate after discharge (%) | defect generation % |
| 1 | 24 | 36 | 20 | 20 | 40 | 450 | 520 | 0 | 0 |
| 2 | 24 | 31 | 21 | 24 | 45 | 470 | 560 | 0 | 0 |
| 3 | 24 | 28 | 30 | 18 | 48 | 490 | 590 | 0 | 0 |
| 4 | 24 | 26 | 38 | 12 | 50 | 460 | 550 | 0 | 0 |
| 5 | 24 | 24 | 36 | 16 | 52 | 500 | 600 | 0 | 0 |
| 6 | 24 | 20 | 40 | 16 | 56 | 510 | 630 | 0 | 0 |
| 7 | 24 | 39 | 12 | 25 | 37 | 410 | 460 | 0 | 50 |
| 8 | 24 | 16 | 42 | 18 | 60 | 550 | 680 | 100 | 10 |

As is apparent from Table 1, Samples 1 to 6, in which types of glass frit having the total content of $SiO_2$ and $Al_2O_3$ of about 40 to 56 molar percent were employed, did not suffer from internal defects or from reduced capacitance.

In contrast, half of the test pieces using the conductive paste in Sample 7, in which the type of glass frit having the total content of $SiO_2$ and $Al_2O_3$ of 37 molar percent was used, suffered from internal defects. This is because the flowability of the glass was high during the sintering of the external electrodes, causing the glass contained in the external electrode layer to infiltrate into the gap of the ceramic body generated by the volume increase of the internal electrodes. As a consequence, the amount of glass contained in the external electrode was reduced, allowing the plating solution to easily infiltrate, thereby generating internal defects.

Furthermore, Sample 8 in which the type of glass frit having the total content of $SiO_2$ and $Al_2O_3$ of 60 molar percent was used, suffered both internal defects and reduced capacitance. This was because the flowability of the glass during the sintering of the external electrode was low, inhibiting sintering of Ag, causing the plating solution to infiltrate, and thereby generating internal defects. Moreover, because the diffusion of Ag through glass was limited, the internal and external electrodes were not satisfactorily connected.

As described above, by using the conductive paste of the present invention, it becomes possible to form highly reliable external electrodes capable of inhibiting the generation of defects inside the ceramic composite while securing the connections between the internal and external electrodes even when plating is performed on the external electrodes.

What is claimed is:

1. A conductive paste comprising an Ag-based conductive component, an organic vehicle and a glass frit,
   wherein the glass frit comprises $B_2O_3$, $SiO_2$, PbO and $Al_2O_3$; and
   wherein the total content of $SiO_2$ and $Al_2O_3$ in the glass frit is in the range of about 40 to 56 molar percent.

2. A conductive paste according to claim 1, wherein the $B_2O_3$ content in the glass frit is in the range of about 10 to 30 molar percent of the glass frit and the balance is PbO.

3. A conductive paste according to claim 2, wherein the $SiO_2$ content in the glass frit is in the range of about 20 to 40 molar percent and the $Al_2O_3$ content in the glass frit is in the range of about 12 to 24 molar percent.

4. A conductive paste according to claim 3, wherein the volume ratio of the conductive component to the glass frit is in the range of about 92:8 to 80:20.

5. A conductive paste according to claim 4, wherein the total content of $SiO_2$ and $Al_2O_3$ in the glass frit is in the range of about 46 to 52 molar percent.

6. A conductive paste according to claim 5, wherein the $SiO_2$ content in the glass frit is in the range of about 26 to 36 molar percent and the $Al_2O_3$ content in the glass frit is in the range of about 14 to 20 molar percent.

7. A conductive paste according to claim 1, wherein the $SiO_2$ content in the glass frit is in the range of about 20 to 40 molar percent and the $Al_2O_3$ content in the glass frit is in the range of about 12 to 24 molar percent.

8. A conductive paste according to claim 1, wherein the volume ratio of the conductive component to the glass frit is in the range of about 92:8 to 80:20.

9. A conductive paste according to claim 1, wherein the total content of $SiO_2$ and $Al_2O_3$ in the glass frit is in the range of about 46 to 52 molar percent.

10. A multi-layer ceramic electronic component comprising:

a ceramic composite having outer surface end faces and comprising a plurality of stacked ceramic layers; and a pair of external electrodes, each of which is disposed on an outer surface end face of the ceramic composite, wherein the external electrodes comprise a baked conductive paste comprising a Ag-containing conductive component and a glass frit, in which the glass frit comprising $B_2O_3$, $SiO_2$, PbO and $Al_2O_3$ and in which the total content of $SiO_2$ and $Al_2O_3$ in the glass frit is in the range of about 40 to 56 molar percent.

11. A multi-layer ceramic electronic component according to claim 10, the ceramic composite further comprising a plurality of internal electrodes each of which is disposed between ceramic layers and has one end thereof exposed on an end face of the ceramic composite, wherein each internal electrode is electrically connected to only one of the pair of external electrodes.

12. A multi-layer ceramic electronic component according to claim 11, wherein the multi-layer ceramic electronic component is a multi-layer ceramic capacitor.

13. A multi-layer ceramic electronic component according to claim 10, further comprising a plating layer covering each of the external electrodes.

14. A multi-layer ceramic electronic component according to claim 10, wherein each ceramic layer comprises a Pb-perovskite-type ceramic.

15. A multi-layer ceramic electronic component according to claim 14, wherein $SiO_2$ content in the glass frit is in the range of about 20 to 40 molar percent, and the $Al_2O_3$ content in the glass frit is in the range of about 12 to 24 molar percent.

16. A multi-layer ceramic electronic component according to claim 15, wherein the $B_2O_3$ content in the glass frit is in the range of about 10 to 30 molar percent and the balance is PbO.

17. A multi-layer ceramic electronic component according to claim 16, wherein the volume ratio of the conductive component to the glass frit is in the range of about 92:8 to 80:20.

18. A multi-layer ceramic electronic component according to claim 10, wherein $SiO_2$ content in the glass frit is in the range of about 20 to 40 molar percent, and the $Al_2O_3$ content in the glass frit is in the range of about 12 to 24 molar percent.

19. A multi-layer ceramic electronic component according to claim 10, wherein the $B_2O_3$ content in the glass frit is in the range of about 10 to 30 molar percent and the balance is PbO.

20. A multi-layer ceramic electronic component according to claim 10, wherein the volume ratio of the conductive component to the glass frit is in the range of about 92:8 to 80:20.

* * * * *